United States Patent
Chong

(10) Patent No.: US 10,880,133 B2
(45) Date of Patent: Dec. 29, 2020

(54) VOLTAGE-MODE TRANSMITTER DRIVER

(71) Applicant: Euhan Chong, Ottawa (CA)

(72) Inventor: Euhan Chong, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 10 days.

(21) Appl. No.: 15/976,545

(22) Filed: May 10, 2018

(65) Prior Publication Data
US 2019/0349226 A1    Nov. 14, 2019

(51) Int. Cl.
| H03H 7/30 | (2006.01) |
| H04L 25/03 | (2006.01) |
| H03M 9/00 | (2006.01) |
| H03K 19/0185 | (2006.01) |
| H04L 25/02 | (2006.01) |
| H03K 17/10 | (2006.01) |

(52) U.S. Cl.
CPC ..... *H04L 25/03885* (2013.01); *H03K 17/102* (2013.01); *H03K 19/018571* (2013.01); *H03M 9/00* (2013.01); *H04L 25/0272* (2013.01); *H04L 25/0278* (2013.01)

(58) Field of Classification Search
CPC .......... H04L 25/03885; H04L 25/0272; H04L 25/0278; H03K 17/102; H03K 19/018571; H03M 9/00
USPC ....................................................... 375/232
See application file for complete search history.

(56) References Cited

U.S. PATENT DOCUMENTS

| 2007/0230515 A1 | 10/2007 | To et al. | |
| 2008/0001630 A1* | 1/2008 | Phang | H03K 19/018528 326/82 |
| 2010/0225422 A1* | 9/2010 | Rofougaran | H01L 23/66 333/204 |
| 2012/0025800 A1 | 2/2012 | Dettloff et al. | |
| 2012/0042104 A1* | 2/2012 | Wang | G06F 13/4291 710/106 |
| 2013/0342241 A1* | 12/2013 | Boecker | H03K 17/165 327/108 |
| 2016/0248518 A1 | 8/2016 | Parikh | |
| 2017/0265062 A1* | 9/2017 | Guerra | H04W 8/22 |

FOREIGN PATENT DOCUMENTS

CN    202634471 U    12/2012

OTHER PUBLICATIONS

Tonietto et al., "A 7.5Gb/s Transmitter with Self-Adaptive FIR", 2008 IEEE Symposium on VLSI Circuits Digest of Technical Papers, pp. 198-199.

* cited by examiner

*Primary Examiner* — Dhaval V Patel

(57) ABSTRACT

Devices and methods for finite impulse response (FIR) feed forward equalization (FFE) at a transmitter are provided. A voltage-mode driver circuit has a main driver and an equalization driver. The main driver drives the digital output signal based on a received digital input signal. The equalization function of the equalization driver is enabled or disabled for a short duration of time to provide at least one of FIR equalization and pre-emphasis to the digital output signal. Pre-emphasis is effected by enabling a low-resistance path of the equalization driver based on the digital input signal such that, when the low-resistance path is enabled, it reduces the transmission resistance for a short period of time.

18 Claims, 8 Drawing Sheets

VOLTAGE-MODE TRANSMITTER DRIVER

FIELD

The present disclosure relates to transmission over a serial connection, such as those using serializer-deserializers (SerDes). In particular, the present disclosure relates to devices and methods for increasing the amplitude of a transmitted signal using a voltage-mode transmitter driver.

BACKGROUND

A serializer-deserializer (SerDes, or SERDES) is a pair of functional blocks (a serializer at the transmitter, and a deserializer at the receiver) used for high-speed communication between two systems, such as two application-specific integrated circuits (ASICs), across a limited input/output link between the two systems.

Generally, each system will include at least one SerDes transmitter and at least one SerDes receiver, thereby allowing bidirectional communication, although some such SerDes will use only transmitters on the first system and only receivers on the second system. In any case, SerDes links are traditionally designed with standalone transmitter (TX) and receiver (RX) sides.

SerDes transmitters conventionally use a voltage-mode driver and implement finite impulse-response (FIR) feed forward equalization (FFE) of the transmitted signal to compensate for channel loss or distortion. Most commonly, post-cursor equalization is used: one or more single-unit-interval tap delays are used to provide delayed post-cursor samples of the transmitted signal, and these delayed samples are weighed and subtracted from the current signal level to correct for expected time-varying impulse response levels introduced by the communication channel. However, pre-cursor equalization is also possible.

This conventional FIR FFE results in de-emphasis, as the signal peak amplitude level is maintained and the low frequency amplitude is reduced. This reduces the signal-to-noise ratio (SNR), because the eye opening is reduced in order to compensate for inter-symbol interference (ISI).

A simple conventional voltage-mode transmitter driver circuit 10 without equalization is shown in FIG. 1A. A differential digital input signal 106 is received by a TXP ("transmitter plus") tap 12 and a TXM ("transmitter minus") tap 14 which drive a digital output signal based on the digital input signal 106 across a pair of resistive paths 20 and over a differential communication channel 130 to a receiver-side termination 140. The receiver-side termination 140 matches the impedance of the resistive paths 20 of the transmitter driver 10; for example, the resistive paths 20 and the receiver-side termination 130 may each provide an impedance of 50 Ohms. The differential communication channel 130 is generally lossy, resulting in signal loss or degradation in the absence of equalization applied at either the transmitter or receiver end.

A conventional implementation of a voltage-mode transmitter driver circuit using 1-tap post-cursor FIR equalization is shown in FIG. 1B. The driver circuit 100 includes a main tap driver 102 and a parallel FIR tap driver 104. A digital input signal 106 is received by the driver circuit 100 carrying the data to be transmitted over a communication channel. At the first parallel branch at the top of the figure, the main driver 102 receives the digital input signal 106 and drives a digital output signal 120 based on the digital input signal 106 across a communication channel. At the second parallel branch at the bottom of the figure, the digital input signal 106 passes through a one-unit-interval delay 110 to produce a delayed input signal 118. The delayed input signal 118 is processed by FIR data generation logic 108, such as a weight applied to the delayed input signal 118 based on the expected FIR of the first post-cursor tap, to generate FIR data 116. The FIR tap driver 104 receives the FIR data 116 and applies 1-tap post-cursor FIR equalization to the digital output signal 120. This example implementation uses a main driver resistive path 112 in parallel with a FIR driver resistive path 114 in parallel to maintain a nominal transmitter impedance of 50 Ohms at all times. In general, FIR equalization is set during a calibration process that is often performed only at startup. The resistance of each branch (the first path through the main tap driver 102, and the second path through the FIR tap driver 104) is not typically changed during operation in response to changes in the received digital input signal 106.

An example conventional FIR tap driver slice 200 is shown in FIG. 2A. The FIR tap driver slice 200 receives FIR data 202 at a PMOS transistor 206 and an NMOS transistor 208. A pair of switches 210 operate to enable equalization by enabling the FIR driver 200; multiple such driver slices 200 may be placed in parallel and selectively enabled or disabled to apply FIR equalization.

When the driver slice 200 is enabled, the NMOS transistor 208 creates a shunt path to ground 212, effectively increasing resistance and providing de-emphasis.

The FIR tap driver slice 200 provides an equalization output signal 204 via a resistive path 214.

A graph showing the amplitude of the transmitted signal with and without FIR equalization, as generated by conventional driver circuit 100 from FIG. 1B, is shown in FIG. 2B. The graph 250 shows a solid line 252 indicating the amplitude of the transmitted signal with FIR equalization applied and a dashed line 254 indicating the amplitude of the transmitted signal with no equalization applied. The peak-to-peak amplitude 256 is the same in both cases.

However, the de-emphasis applied by conventional FIR equalization has undesirable characteristics. The amplitude of the signal at the transmitter limits the maximum channel capacity according to the Shannon-Hartley theorem. As such, de-emphasis of the signal at the transmitter, as performed in a conventional FIR equalization, limits the maximum channel capacity. In example PAM-4 implementations, a 9 decibel loss from FIR equalization has been measured relative to non-return-to-zero (NRZ) scenarios.

Furthermore, power consumption increases with the amount of equalization applied in conventional FIR equalization. The shunt path to ground is enabled by the FIR tap driver 104 to reduce the signal amplitude.

Alternatives to the use of FIR equalization of a voltage-mode driver have been considered. A "resistance-mode" driver has been described by Ranko Sredojević and Vladimir Stojanović in their 2011 paper "Fully Digital Transmit Equalizer With Dynamic Impedance Modulation", IEEE JOURNAL OF SOLID-STATE CIRCUITS, VOL. 46, NO. 8. The described resistance-mode driver abandons the impedance matching constraint between the transmitter and receiver (as in FIG. 1A), using a variable transmitter resistance to equalize the channel. High frequency components of the signal have reduced resistance, while low frequency components have a higher resistance. This is potentially more power efficient than conventional FIR transmitter equalization because the signal level is reduced by increasing the transmitter impedance rather than using the shunt path to ground 212 provided by the FIR tap driver slice 200 from FIG. 2A.

This approach may also present certain disadvantages. First, it is more complex to implement. Second, it has the same signal swing as a current-mode or voltage-mode driver; thus, it has the same problem of reducing the data eye opening due to de-emphasis, with this effect being more pronounced the more equalization is applied. Third, varying the impedance can create signal reflections in the channel that limit performance. The implementation described in the paper operates by varying resistance from 3,000 Ohms to 50 Ohms, giving rise to more signal reflection than a voltage-mode driver. Overall, these disadvantages make the approach of a resistance-mode driver unsuitable for high-speed applications. The illustrated implementation may result in severe limits on the maximum data-rate and the overall power efficiency is reduced by the use of high pre-driver digital power relative to a conventional FFE approach.

Thus, there remains a need for a SerDes transmitter driver that can increase amplitude in a power-efficient way to avoid the de-emphasis problem that reduces SNR.

SUMMARY

The present disclosure describes example devices and methods to increase the amplitude of a transmitted signal using a voltage-mode transmitter driver.

According to some aspects, the present disclosure describes a transmitter driver circuit for transmitting a digital output signal. The circuit comprises a main driver for driving transmission of the digital output signal across a communication channel based on a received digital input signal, and an equalization driver arranged in parallel with the main driver. The equalization driver comprises a variable-resistance path for receiving the digital input signal and providing pre-emphasis to the digital output signal by, in response to changes in the amplitude of the digital input signal, reducing the resistance of the variable-resistance path for a predetermined period of time.

According to a further aspect, which can be combined with other embodiments disclosed herein, the equalization driver provides equalization to the digital output signal based on a first data signal and a second data signal. The first data signal and the second data signal each have a disabling value and an enabling value. The variable-resistance path switches between a baseline resistance in response to disabling values of the first and second signals, and a low resistance in response to an enabling value of the first or second signal. The equalization driver further comprises a power source for providing positive polarity signal gain to the digital output signal via the variable-resistance path in response to an enabling value of the first signal, and providing negative polarity signal gain to the digital output signal via the variable-resistance path in response to an enabling value of the second signal.

According to a further aspect, which can be combined with other embodiments disclosed herein, the present disclosure describes a method for equalizing an output signal. The method comprises detecting an input data signal, generating a delayed version of the input data signal, and, if a value of the input data signal has changed relative to the delayed version, enabling a low-resistance path, providing pre-emphasis to the output signal via the low-resistance path for a predetermined duration, and at the end of the predetermined duration, disabling the low-resistance path and disabling pre-emphasis.

According to a further aspect, which can be combined with other embodiments disclosed herein, the present disclosure describes an equalization driver for providing equalization to an output signal based on a first data signal and a second data signal. The first data signal and the second data signal each have a disabling value and an enabling value. The equalization driver comprises a variable-resistance path for switching between a baseline resistance in response to disabling values of the first and second signals and a low resistance in response to an enabling value of the first or second signal. The equalization driver also comprises a power source for providing positive polarity signal gain to the output signal via the variable-resistance path in response to an enabling value of the first signal, and providing negative polarity signal gain to the output signal via the variable-resistance path in response to an enabling value of the second signal.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

The present disclosure describes example devices and methods for using a transmitter driver to transmit a digital signal with increased peak-to-peak amplitude in a power-efficient manner. While most of the described examples relate to a voltage-mode driver, current-mode versions of the driver are also contemplated.

A voltage-mode transmitter driver is described that implements variable transmitter impedance or resistance to increase the amplitude of the transmitted signal, thereby providing large-swing pre-emphasis. The transmitter output impedance is dynamically varied for a short predefined period of time, such as a single unit interval of the transmitted digital signal, to achieve high amplitude FIR equalization. The equalization is equivalent to single post-cursor tap feed-forward equalization, but with larger swing (i.e. larger peak-to-peak amplitude).

This variable-impedance equalization can be combined in some examples with conventional FIR equalization. In described examples, the variable-impedance equalization does not affect the absolute value of the FIR taps, which are implemented as part of an equalization driver parallel to the main driver. Only the main signal cursor driven by the main driver is affected.

Insofar as the described drivers demonstrate variable voltage as well as variable resistance to achieve equalization, they could be considered hybrid drivers implementing both voltage-mode and resistance-mode features. Alternatively, the described drivers could be implemented as a hybrid implementing both current-mode and resistance-mode features. The description below of voltage-mode drivers will be appreciated to apply equally to hybrid voltage-mode/resistance-mode drivers as well as hybrid current-mode/resistance-mode drivers. However, the example drivers described herein differ from previously proposed resistance-mode drivers in several key respects, as set out in further detail below.

Figure 1A:
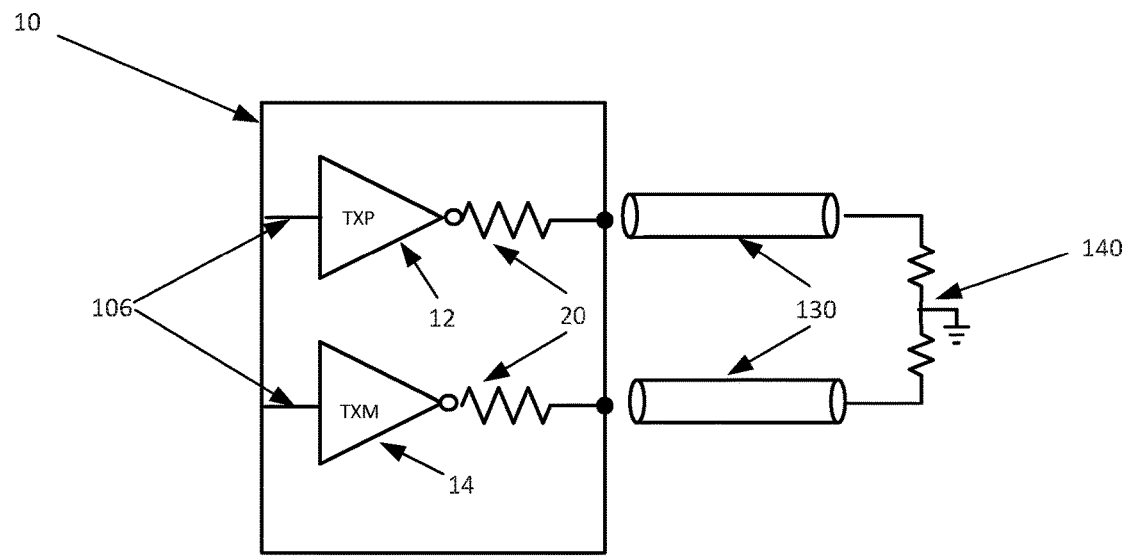
FIG. 1A is a block diagram showing the differential implementation of a known example voltage-mode transmitter driver without equalization.
Figure 1B:
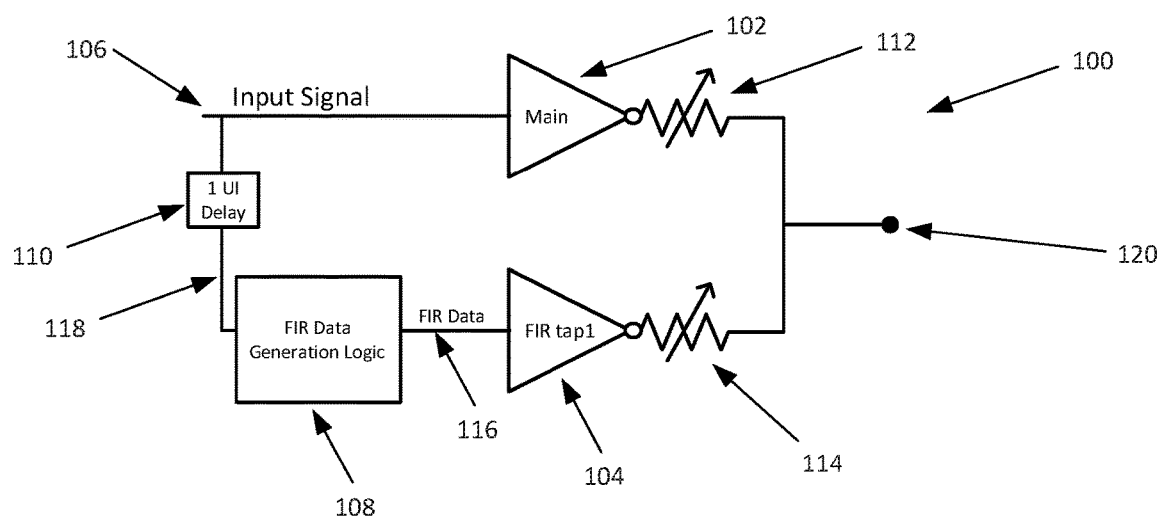
FIG. 1B is a block diagram showing a known example voltage-mode transmitter driver using FIR equalization.
Figure 2A:
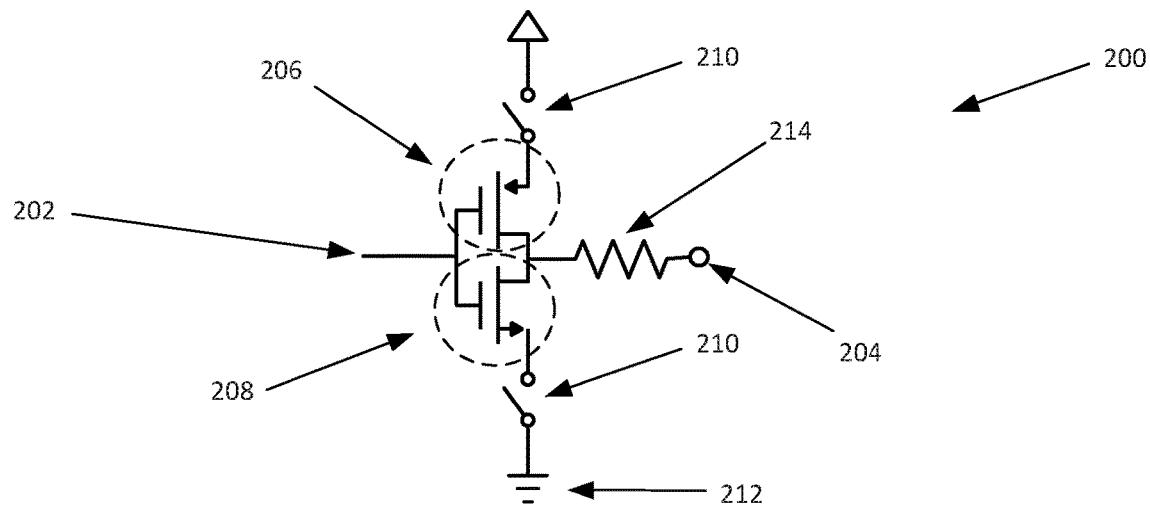
FIG. 2A is a block diagram of a known example FIR tap driver slice.

The power overhead of example variable-resistance voltage-mode drivers is small compared to conventional voltage-mode drivers with boosted amplitude. Varying the transmission resistance for a short period of time is more power-efficient method of increasing amplitude and swing than scaling the voltage-mode driver resistance down overall. In a conventional voltage-mode driver such as shown in driver circuit 100 in FIG. 1B, only the main driver 102 substantively contributes to peak swing. The FIR driver 104 creates a shunt path to ground (as shown in FIG. 2A) which not only reduces swing, but also increases power usage as more equalization is applied.

However, in the described examples, both the main driver and the equalization driver contribute to peak swing, increasing power efficiency for achieving the same swing. Another factor contributing to the power efficiency of described examples is the possibility that an equivalent driver can be built at half the size of a conventional driver of equivalent swing.

Furthermore, in described examples, the risk of electrostatic overstress (EOS) is relatively small, as a smaller power supply can be used to achieve the same swing as a conventional driver. By the use of a smaller power supply and thereby reducing the risk of EOS, swing can be extended farther than could typically be safely achieved using a current-mode high-swing driver, as EOS risk is one of the limiting factors in achieving high swing in such a driver.

The described examples maintain the same complexity and speed of FFE tap equalization for most taps.

Figure 3:
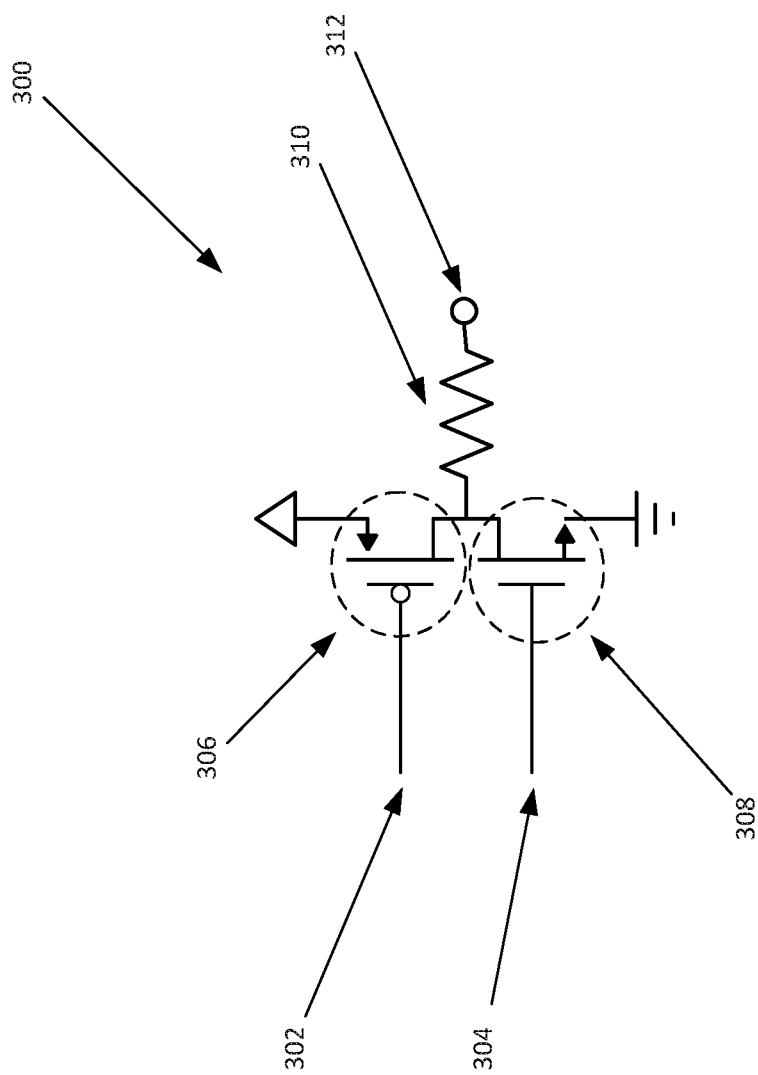
FIG. 3 is an example circuit implementation of an equalization driver slice according to a described example embodiment.

With reference to the drawings, FIG. 3 shows an example circuit implementation of an equalization driver slice 300 according to the present disclosure, corresponding to and replacing the FIR tap driver slice 200 of FIG. 2A. The equalization driver slice 300 separates the differential input signal into a PMOS input signal 302 and a NMOS input signal 304 providing input to a PMOS transistor 306 and an NMOS transistor 308 respectively. The equalization driver slice 300 produces an output signal at output port 312 via a resistive path 310. Importantly, and in contrast to the conventional FIR tap driver slice 200, the equalization driver slice 300 does not need to use switches such as switch 210 to enable or disable the application of equalization; instead, the independent inputs 302,304 allow for individual control of PMOS transistor 306 and NMOS transistor 308. This allows either or both of the PMOS transistor 306, the NMOS transistor 308 to be turned off at any given time. When both the PMOS transistor 306 and NMOS transistor 308 are disabled through the use of inputs 302 and 304, the equalization driver slice 300 effectively acts as a high-impedance path. This may sometimes be referred to as a "tri-state mode".

Figure 4:
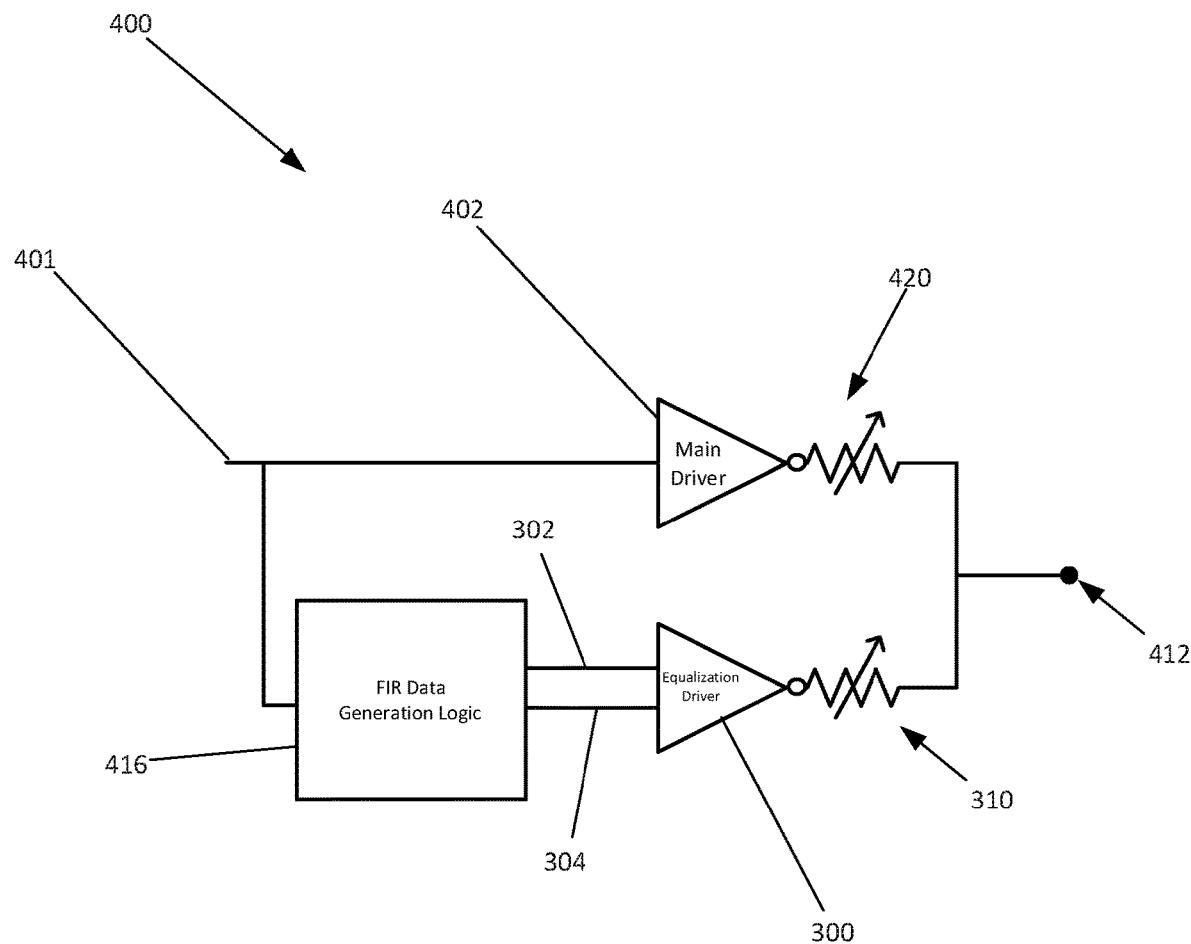
FIG. 4 is a block diagram showing an example implementation of a voltage-mode driver circuit according to a described example embodiment.

FIG. 4 shows an example implementation of a voltage-mode driver circuit 400 with variable impedance. The driver circuit 400 has a main driver 402 (also referred to as a main tap driver) and an equalization driver 300 (also referred to as a FIR tap driver) connected in parallel. Both the main driver 402 and the equalization driver 300 are configured to receive digital input signal 401. When no equalization is required, the equalization driver 404 operates in "tri-state" or high-impedance mode as described above in reference to FIG. 3 and the main driver 402 provides a baseline impedance, such as 50 Ohms, via the main driver resistive path 420. When equalization is enabled, however, the equalization driver 300 is enabled via either the PMOS transistor 306 or NMOS transistor 308, and an equalization driver resistive path 310 having the same impedance as the main driver resistive path 420 operates in parallel with the main driver resistive path 420. In this scenario, voltage division determines the amplitude of the digital output signal 712 measured at output port 412 driven by the main driver 402; with a 50 Ohm main driver resistive path 420 and a 50 Ohm equalization driver resistive path 310, the effective impedance of the circuit 400 would be 25 Ohms as a result of voltage division.

By maintaining the baseline impedance (e.g. 50 Ohms) when no equalization is required, low frequency content of the digital output signal 712 at the output port 512 is unaffected by the variable-impedance method, and reflections in the communication channel are minimized. When equalization is required, the equalization driver 300 is enabled for a short time, such as for a single unit interval of time. This short duration of equalization can compensate for noise introduced, e.g., by a change in the level of the data input signal. During periods when equalization is not required, the equalization driver 300 is disabled. The main driver 402 and the equalization driver 300 never drive in opposite directions, as there is no shunt to ground as in a conventional driver (e.g. conventional FIR driver slice 200). This reduces power consumption relative to conventional drivers using FIR equalization.

In this illustrated embodiment, the equalization driver uses FIR data generation logic 416 having a unit unit-interval delay, thereby providing single post-cursor tap equalization. The FIR generation logic 516 maintains separate differential inputs, PMOS input signal 302 to the PMOS transistor 306 and NMOS input signal 304 to the NMOS transistor 308, to the equalization driver 300. In other examples, it is possible to implement the described method using multiple tap delays and multiple post-cursor taps to provide multiple post-cursor tap equalization (e.g. compensating for ISI from multiple post-cursor samples). In some examples, pre-cursor as well as, or in place of, post-cursor equalization may be applied using these techniques.

Furthermore, the illustrated embodiment can use the equalization driver 300 to provide both variable impedance equalization and FIR equalization. Some example embodiments implement FIR equalization in conjunction with variable-impedance, while other embodiments are implemented without the use of FIR equalization. The magnitude of the signal measured at the first post-cursor tap (and at any other post-cursor taps used in other embodiments for FIR equalization) can be small, and so may employ conventional FIR equalization with a small power penalty. The absolute amplitude of the signal measured at the first post-cursor tap embodied in the FIR data generation logic 416 and any other post-cursor taps is not affected by the lower impedance created by enabling the equalization driver 300, which only affects the amplitude of the output signal 712 at the output port 412. In this example circuit 400, the FIR conventional FIR de-emphasis equalization may be activated or deactivated as needed.

It is also possible in some examples to use one or more analog tap delays rather than (or in addition to) one or more one-unit-interval tap delays. Whereas a conventional tap delay would generally use a flip-flop (FF) to implement a one-unit-interval delay, an analog tap delay may have a variable delay duration. As such the analog tap delay may generate a delayed input signal with a variable duration delay. For example, a resistor-capacitor (RC) circuit may be used in place of a flip-flop to implement an analog delay. In other examples, a digital tap delay may be used with a variable delay duration based on the use of multiple flip-flops in series, each contributing one UI of delay. In either the analog or digital case, control logic may be used to vary the amount of delay applied in operation, either by tuning the amount of analog delay of the RC circuit or by switching in or out one or more of the flip-flops chained in series. In some examples, this variable duration delay may be used to control the absolute delay of the delayed input signal to allow a fine tuning of the FIR equalization based on pre-cursor inter-signal interference. In other examples, the variable duration delay may also or in addition control the duration of the period over which equalization is applied, i.e. the time period over which the equalization driver 300 is enabled.

In the illustrated example driver circuit 400, the main driver 502 can be implemented as being identical to the main tap driver 102 of the conventional driver circuit 100. Those skilled in the art will appreciate that the use of a different implementation of the main driver 402 is contemplated and should not be considered as outside the intended scope. The equalization driver 104 is similar to the FIR tap driver 104 of the conventional driver circuit 100, with two main differences.

First, the size of the equalization driver 300 is smaller than the main driver 402. In some examples, it may be approximately ½ or ⅓ the size of the main driver 402. Generally, a smaller sized equalization driver 300 is more power efficient, but it provides a higher resistance. Thus, the resistance value of the equalization driver resistive path 310 must be decreased in compensation to maintain a consistent total resistance.

Second, the inputs 302,304 to the equalization driver 300 are separated such that the PMOS transistor 306 and NMOS transistor 308 can be driven independently by the PMOS input signal 302 and NMOS input signal 304 respectively.

In driver circuit 400, FIR data generation logic 416 is used to generate differential control signals 302,304 that govern the equalization driver 300. In place of a pre-driver inverter buffer as used in the conventional driver circuit 100, this circuit 400 uses pre-emphasis logic (such as FIR data generation logic 416) to generate the pulses for pre-emphasis. Further details of the FIR data generation logic 416 are provided in reference to FIG. 7 below.

The equalization driver 300 receives multiple inputs 302, 304 that serve to enable and disable its operation. For example, to produce a positive step, the PMOS input signal 302 to the PMOS transistor 306 may be enabled and the NMOS input signal 304 to the NMOS transistor 308 may be disabled for a duration of 1 unit interval.

Figure 2B:
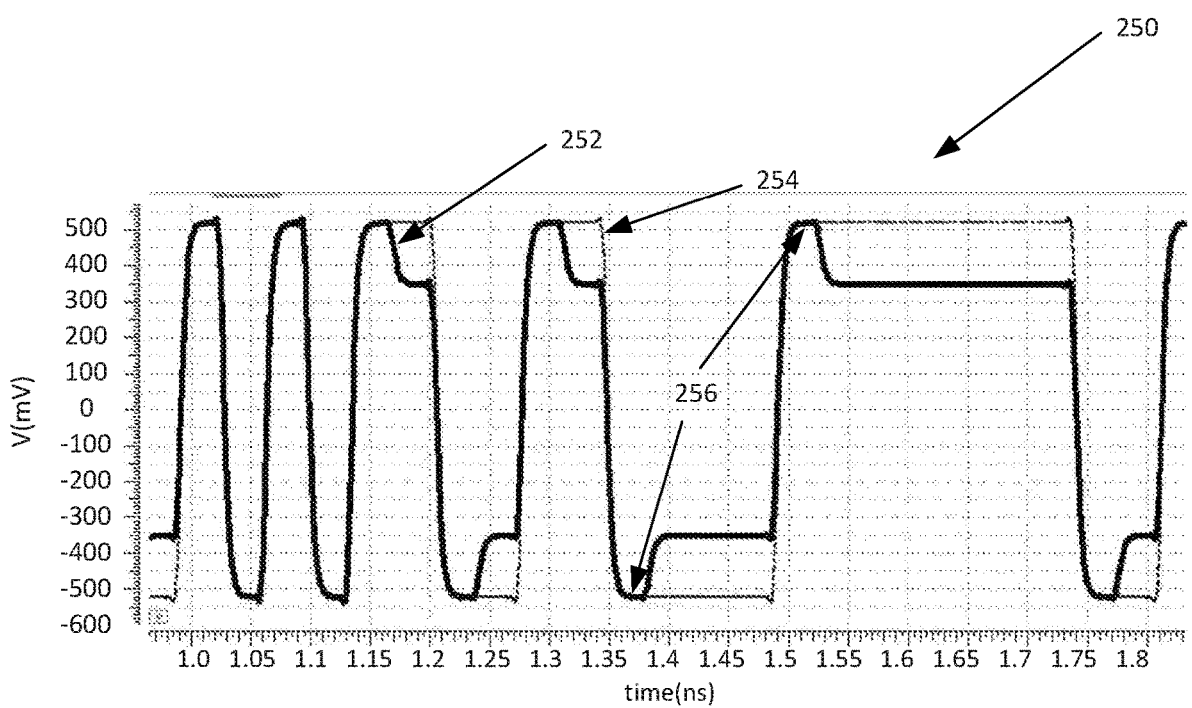
FIG. 2B is a graph showing the amplitude of a transmitted signal generated by the known example driver of FIG. 1B.
Figure 5:
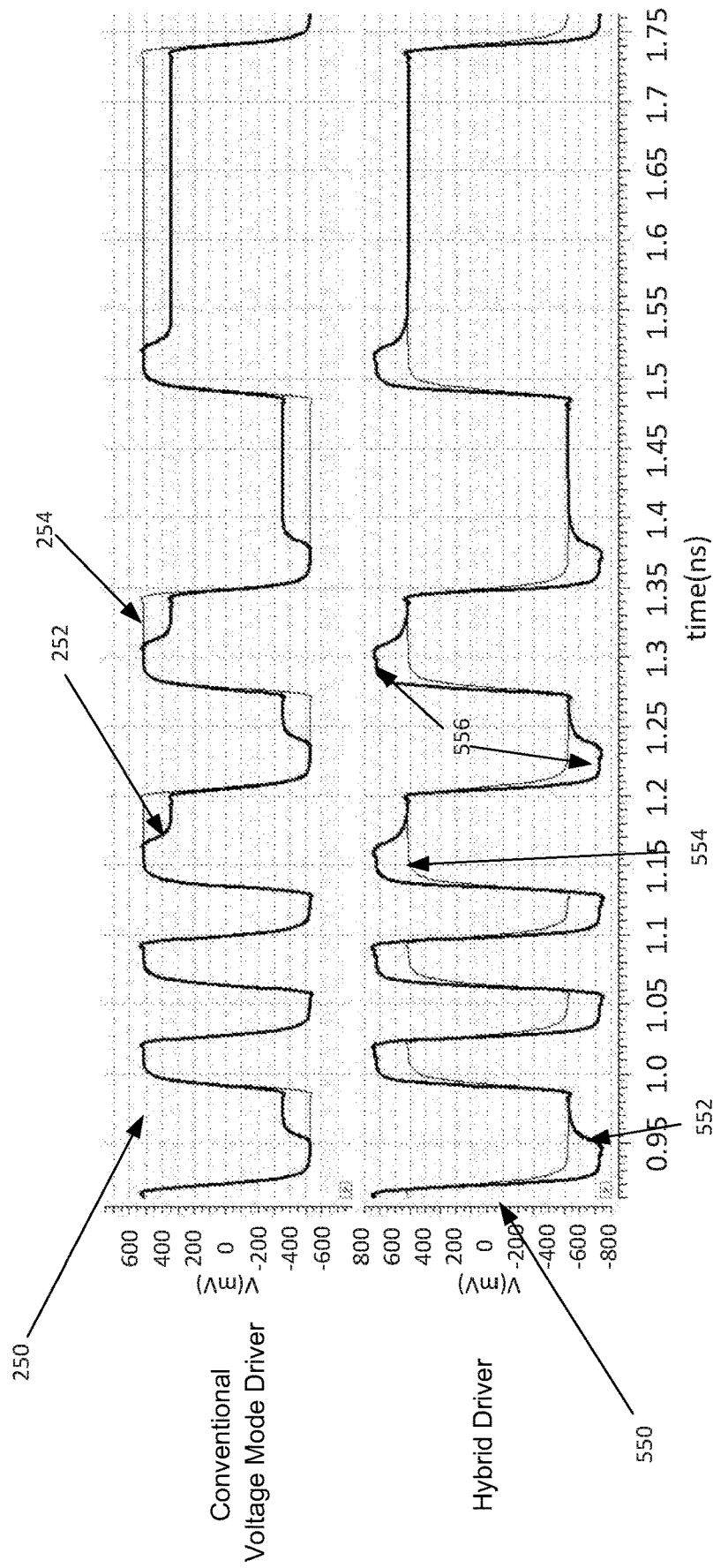
FIG. 5 is a graph showing the amplitude of a transmitted signal generated by the example driver of FIG. 1 at the top (identical to the graph of FIG. 2B), and a transmitted signal generated by a voltage-mode driver with short-duration transmitter output impedance reduction according to an example embodiment at the bottom.

With reference to the drawings, FIG. 5 shows two graphs comparing the amplitude of signals produced by a conventional voltage-mode driver and an example voltage-mode driver with variable impedance as described herein. The graph at the top 250 is identical to graph 250 of FIG. 2B: it shows the amplitude of the conventional driver signal. The solid line 252 indicates the amplitude of the transmitted signal with FIR equalization, and the dashed line 254 indicates the amplitude of the transmitted signal with no equalization applied. The peak-to-peak amplitude 256 is the same in both cases. In this example, the peak-to-peak amplitude 256 is approximately 1.0 volts, from about 500 mV to −500 mV.

The graph at the bottom 550 shows the difference in swing resulting from the described variable-impedance equalization method applied by an example voltage-mode driver. The solid line 552 indicates the amplitude of the transmitted output signal 712 with FIR equalization applied, and the dashed line 554 indicates the amplitude of the transmitted output signal 712 with no FIR equalization applied. The difference between the conventional signal 552,554 and the bottom signal 552,554 is that the latter displays peak-to-peak amplitude 556 that is approximately 1.5 times as great: in the illustrated example, the peak-to-peak amplitude of this method is about 1.5 volts, from about 750 mV to −750 mV. This increased peak-to-peak amplitude demonstrates the pre-emphasis gain provided by the described method and drivers.

Figure 6:
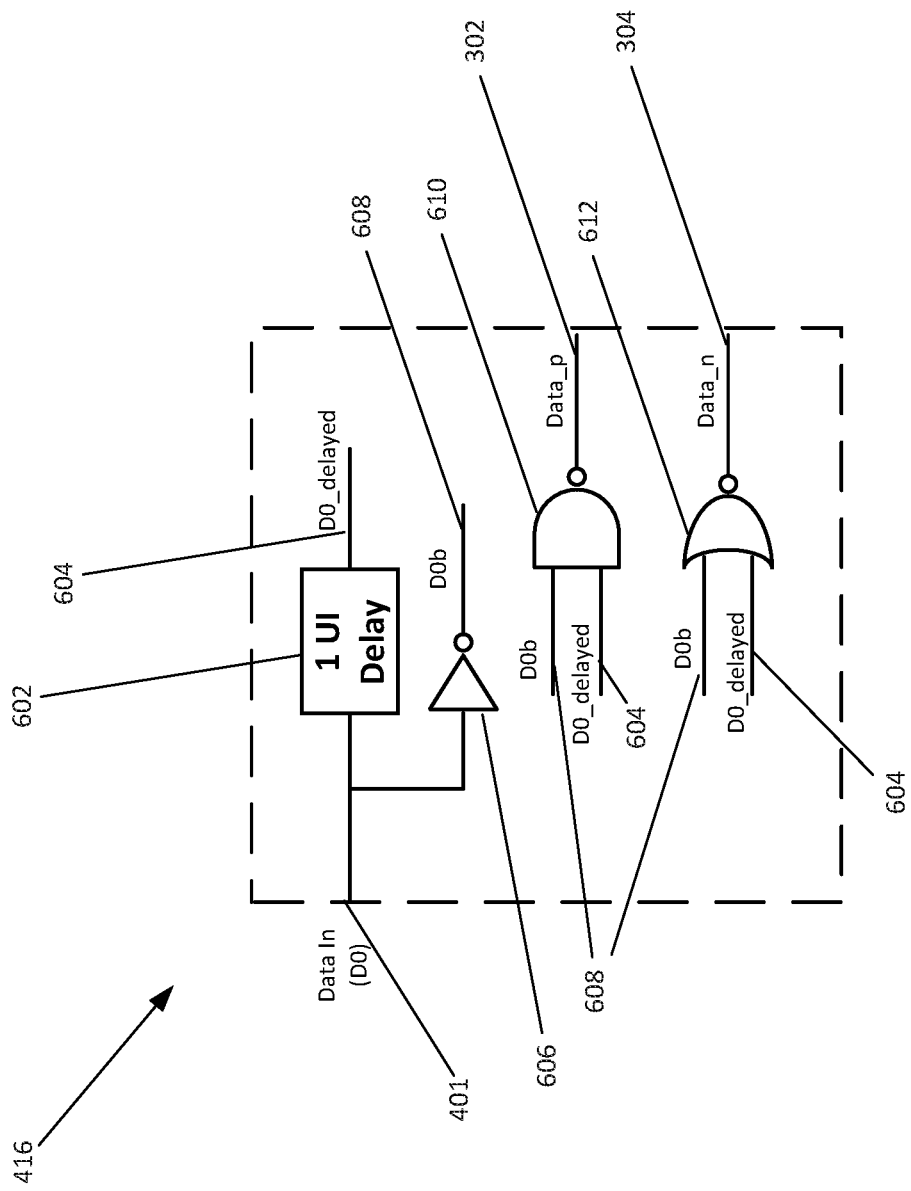
FIG. 6 is a block diagram of an example implementation of a FIR data generation logic as shown in the example driver circuit of FIG. 5.

The FIR data generation logic 416 of the driver circuit 400 of FIG. 4 may be implemented in some examples using logic such as that illustrated in FIG. 6. With reference to FIG. 6, the FIR data generation logic 416 receives the digital input signal 401, and this input signal is fed through a one unit-interval delay 602 to generate a delayed input signal 604. The input signal 401 is also fed through an inverter 606 wired in parallel with the delay 602 to produce an inverted input signal 608.

The delayed input signal 604 and the inverted input signal 608 are fed to a NAND gate 610 to produce the PMOS input signal 302 to the PMOS transistor 306, and fed to a NOR gate 612 to produce the NMOS input signal 304 to the NMOS transistor 308. The PMOS input signal 302 and NMOS input signal 304 are used as the two inputs to the example equalization driver 300 from FIG. 4.

As described above, the one unit-interval delay 602 may be implemented in some examples as a flip-flop. In other examples, the delay module may have a delay with a duration other than one unit interval; for example, it may be a variable-delay circuit such as an analog RC circuit or a plurality of 1 UI flip-flops, and may have the duration of its delay tuned by additional control logic.

Figure 7:
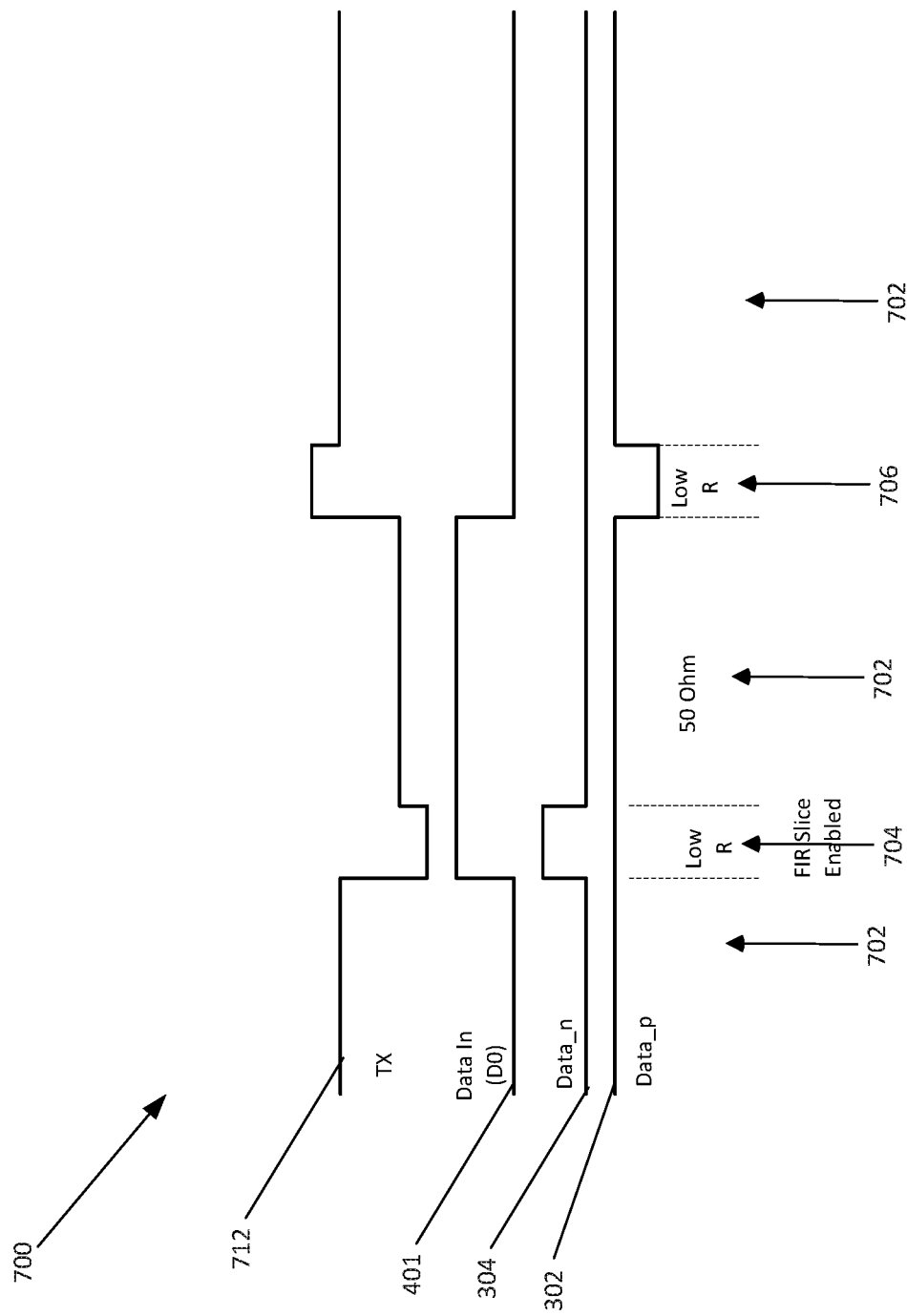
FIG. 7 is a graph of the inputs and outputs of the example FIR data generation logic components of FIG. 6.

In operation of the driver circuit 400, FIR Data Generation Logic 416 enables and disables the equalization driver 300 as needed to equalize changes in the digital input signal 401. FIG. 7 provides a graph 700 illustrating the input and output signals of the FIR data generation logic 416 of FIG. 6 in response to changes in the input signal 401. During periods of no equalization 702, the FIR slice (e.g. equalization driver 300) is disabled (i.e. PMOS input signal 302 and NMOS input signal 304 both have a disabling value as shown), yielding a total transmitter path impedance equal to the resistance of main driver resistive path 420, such as 50 Ohms. In time periods of enabled equalization 704 and 706, the equalization driver 300 is enabled, yielding a lower impedance through voltage division, such as 25 Ohms. This decreased impedance during the first period of enabled equalization 704 is due to the enabling value of the NMOS input signal 304 in response to an upward step of the input signal 401. During the second period of enabled equalization 706, the decreased impedance is due to the enabling value of the PMOS input signal 302 in response to a downward step of the input signal 401. The levels of the PMOS input signal 302 and NMOS input signal 304 result in a transmitter driver output signal 712 amplitude (measured at output port 412) as shown, due to the gain applied by equalization during the unit interval of equalization.

The timing of the pulses produced by the FIR data generation logic 416 to provide pre-emphasis (e.g. at first period 704 and second period 706) follow ordinary design rules aimed at minimizing delay in the path. They are generally within a short time window of the data edges: in some examples, the FIR data generation logic 416 may be designed to minimize this delay to less than 10 picoseconds, or to less than $\frac{1}{10}$ of a unit interval of the system.

Thus, the equalization driver 300 in combination with its resistive path 310 effectively provides a variable-resistance path: when enabled, the equalization driver provides a low-resistance path, and when disabled, it provides a high-resistance path. Furthermore, the example equalization driver 300 combined with its associated FIR data generation logic 416 provides a FIR equalization circuit to provide conventional FIR equalization to the driver output signal 712. In the illustrated examples, this conventional FIR equalization is single-tap post-cursor FIR equalization, but in other examples it could be single- or multi-tap and either pre-, post-, or a combination of pre- and post-cursor FIR equalization.

Figure 8:
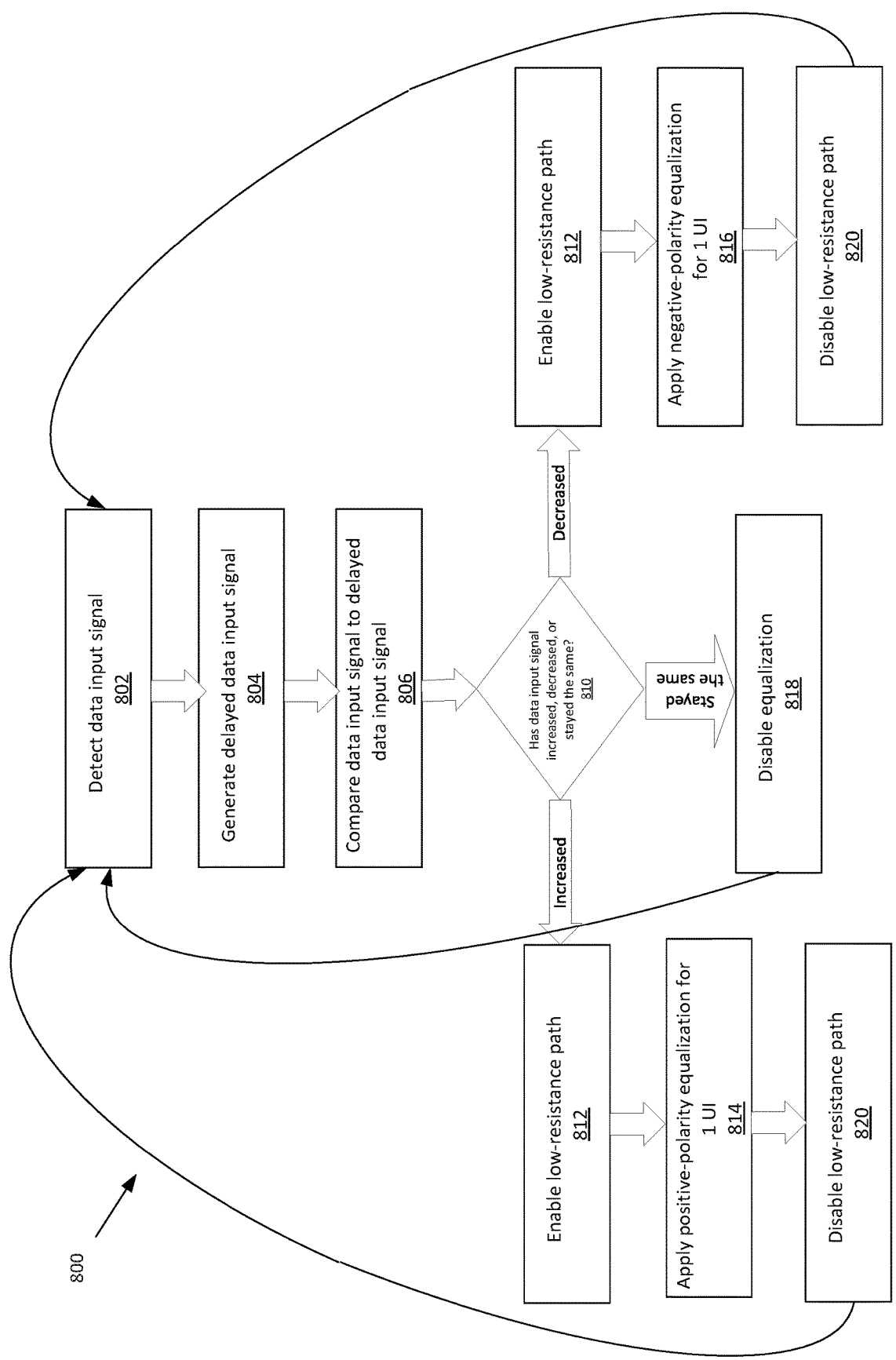
FIG. 8 is a flowchart showing the operation of an example transmitter circuit according to described embodiments.

The operation of the example transmitter circuit 400 in the context of the equalization behaviour of graph 700 is illustrated by the flowchart of FIG. 8, which shows a method 800 for providing transmitter equalization with pre-emphasis. At step 802, the data input signal 401 is detected (e.g. at FIR data generation logic 416). At step 804, a delayed data input signal (such as delayed input signal 604) is generated. At step 806, the data input signal 401 is compared to delayed input signal 602. Step 810 branches the method 800 into three paths depending on whether the current level of the data input signal 401 has increased, decreased, or stayed the same relative to the delayed input signal 602. If the signal has increased (i.e. an upward step in the input data) or decreased (i.e. a downward step in the input data), the low-resistance path of the equalization driver 300 is enabled at step 812. In the case of an increase (i.e. upward step), positive-polarity equalization is applied for a predetermined duration (e.g. 1 UI) at step 814. In the case of a decrease (i.e. downward step), negative-polarity equalization is applied for a predetermined duration (e.g. 1 UI) at step 816. Once this duration has passed, the low-resistance path is disabled at step 820. If there is no change in the data input signal 401, equalization remains disabled at step 818. After step 820 or 818, the method 800 returns to step 802 to process the next data symbol.

Unlike previously described resistance-mode drivers, the described examples are not limited as to data rate by digital logic and encoding of the driver. Rather than implementing de-emphasis by increasing resistance from a baseline, the described technique instead provides pre-emphasis by lowering impedance for a short period of time, e.g. from a 50 Ohm baseline to 25 Ohms. Furthermore, rather than using a resistive DAC to generate digital control signals for the equalization driver, the described examples use a set of analog inputs regulated by very simple logic. These features, combined with increased power-efficiency, make the described examples potentially suitable for high speed SerDes or other high-speed digital transmission applications.

By varying impedance over a short period of time, the described examples avoid the creation of significant signal reflections in the communication channel. The low levels of reflection make this technique potentially suitable for use in applications requiring high performance and low levels of signal reflection.

Some embodiments may apply the described techniques outside of the context of SerDes. Any voltage-mode transmitter communicating across an electrical link can potentially apply the described techniques.

Although the present disclosure describes methods and processes with steps in a certain order, one or more steps of the methods and processes may be omitted or altered as appropriate. One or more steps may take place in an order other than that in which they are described, as appropriate.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A transmitter driver circuit for transmitting a digital output signal, comprising:
   a main driver for driving transmission of the digital output signal across a communication channel based on a received digital input signal;
   an equalization driver arranged in parallel with the main driver, comprising a variable-resistance path for:
      receiving the digital input signal; and
      providing pre-emphasis to the digital output signal to increase the peak-to-peak amplitude of the digital output signal by, in response to changes in the amplitude of the digital input signal, reducing the resistance of the variable-resistance path for a predetermined period of time.

2. The transmitter driver circuit of claim 1 wherein the main driver operates in voltage mode and the digital output signal is a voltage-mode digital signal.

3. The transmitter driver circuit of claim 1 wherein the main driver operates in current mode and the digital output signal is a current-mode digital signal.

4. The transmitter driver circuit of claim 1, wherein the equalization driver further comprises a finite impulse response (FIR) equalization circuit for providing FIR equalization to the digital output signal based on the data input signal.

5. The transmitter driver circuit of claim 4, wherein the FIR equalization circuit further comprises one or more tap delays for generating one or more delayed input signals.

6. The transmitter driver circuit of claim 5, wherein the one or more tap delays comprise a plurality of tap delays and the one or more delayed input signals comprise a plurality of delayed input signals.

7. The transmitter driver circuit of claim 5, wherein:
the one or more tap delays comprises a variable tap delay having a variable delay duration; and
the one or more delayed signals comprises a delayed input signal having a variable delay relative to the digital input signal based on the variable delay duration of the variable tap delay.

8. The transmitter driver circuit of claim 7, wherein the equalization driver varies the duration of the predefined period of time based on the variable delay of the delayed input signal.

9. The transmitter driver circuit of claim 1, wherein:
the equalization driver provides equalization to the digital output signal based on a first data signal and a second data signal, the first data signal and the second data signal each having a disabling value and an enabling value;
the variable-resistance path switches between a baseline resistance in response to disabling values of the first and second signals and a low resistance in response to an enabling value of the first or second signal; and
the equalization driver further comprises a power source for:
providing positive polarity signal gain to the digital output signal via the variable-resistance path in response to an enabling value of the first signal; and
providing negative polarity signal gain to the digital output signal via the variable-resistance path in response to an enabling value of the second signal.

10. The transmitter driver circuit of claim 9 wherein the gain provided is voltage-mode gain.

11. A method for equalizing an output signal, comprising:
detecting an input data signal;
generating a delayed version of the input data signal; and
in response to detecting that a value of the input data signal has changed relative to the delayed version, enabling a low-resistance path;
providing pre-emphasis to the output signal via the low-resistance path to increase the peak-to-peak amplitude of the output signal for a predetermined duration; and
at the end of the predetermined duration, disabling the low-resistance path and disabling pre-emphasis.

12. The method of claim 11, wherein the pre-emphasis is voltage-mode pre-emphasis.

13. The method of claim 11, wherein the duration is one unit interval of the input data signal.

14. The method of claim 11, wherein the step of providing pre-emphasis comprises:
if the value of the input data signal has increased relative to the delayed version, providing positive-polarity pre-emphasis; and
if the value of the input data signal has decreased relative to the delayed version, providing negative-polarity pre-emphasis.

15. The method of claim 11, wherein the step of generating a delayed version comprises introducing 1 unit interval of delay to the input data signal.

16. The method of claim 11, wherein the step of generating a delayed version comprises introducing a variable amount of delay to the input data signal.

17. An equalization driver for providing equalization to an output signal based on a first data signal and a second data signal, the first data signal and the second data signal each having a disabling value and an enabling value, comprising:
a variable-resistance path for switching between a baseline resistance in response to disabling values of the first and second signals and a low resistance in response to an enabling value of the first or second signal; and
a power source for:
providing positive polarity signal gain to the output signal via the variable-resistance path in response to an enabling value of the first signal; and
providing negative polarity signal gain to the output signal via the variable-resistance path in response to an enabling value of the second signal.

18. The equalization driver of claim 17 wherein the gain provided is voltage-mode gain.

* * * * *